(12) United States Patent
Hu et al.

(10) Patent No.: US 11,302,889 B2
(45) Date of Patent: Apr. 12, 2022

(54) FLEXIBLE DISPLAY MODULE HAVING A FLEXIBLE GLASS LAYER

(71) Applicant: Yungu (Gu'an) Technology Co., Ltd., Langfang (CN)

(72) Inventors: Kun Hu, Langfang (CN); Hao Feng, Langfang (CN); Pengle Dang, Langfang (CN); Lu Rao, Langfang (CN); Bo Yuan, Langfang (CN); Shixing Cai, Langfang (CN)

(73) Assignee: Yungu (Gu'an) Technology Co., Ltd., Langfang (CN)

( * ) Notice: Subject to any disclaimer, the term of this patent is extended or adjusted under 35 U.S.C. 154(b) by 65 days.

(21) Appl. No.: 16/526,311

(22) Filed: Jul. 30, 2019

(65) Prior Publication Data

US 2019/0363286 A1    Nov. 28, 2019

Related U.S. Application Data

(63) Continuation of application No. PCT/CN2018/090924, filed on Jun. 13, 2018.

(30) Foreign Application Priority Data

Oct. 31, 2017    (CN) .......................... 201711051573.7

(51) Int. Cl.
*H01L 51/00*      (2006.01)
*H01L 51/52*      (2006.01)
(Continued)

(52) U.S. Cl.
CPC ...... *H01L 51/5246* (2013.01); *H01L 51/5253* (2013.01); *G02F 1/133305* (2013.01);
(Continued)

(58) Field of Classification Search
CPC ............ H01L 51/5246; H01L 51/5253; H01L 51/5293; H01L 51/0097; H01L 2251/5338;
(Continued)

(56) References Cited

U.S. PATENT DOCUMENTS 7,368,307 B2 *  5/2008  Cok ..................... H01L 51/525
                                                              438/26
7,566,254 B2 *  7/2009  Sampica ................. H01L 51/56
                                                              156/358

(Continued)

FOREIGN PATENT DOCUMENTS

CN        102629015 A       8/2012
CN        103346163 A       10/2013
(Continued)

OTHER PUBLICATIONS

PCT International Search Report dated Aug. 22, 2018 in International Application No. PCT/CN2018/090924.
(Continued)

*Primary Examiner* — Ida M Soward
(74) *Attorney, Agent, or Firm* — Rimon PC

(57) ABSTRACT

A flexible display module and a method for manufacturing the same solve a problem that the existing flexible display module is easy to be failure after being bent. The flexible display module includes: a flexible glass layer; and a display panel disposed inside the flexible glass layer.

19 Claims, 7 Drawing Sheets

(51) Int. Cl.
*H01L 27/14* (2006.01)
*H01L 27/32* (2006.01)
*G02F 1/133* (2006.01)
*G02F 1/1335* (2006.01)
*G02F 1/1333* (2006.01)
*H01L 27/146* (2006.01)

(52) U.S. Cl.
CPC .. *G02F 1/133528* (2013.01); *H01L 27/14678* (2013.01); *H01L 27/323* (2013.01); *H01L 51/5293* (2013.01); *H01L 2251/301* (2013.01); *H01L 2251/5338* (2013.01); *H01L 2251/558* (2013.01)

(58) Field of Classification Search
CPC ......... H01L 2251/301; H01L 27/14678; H01L 27/323; G02F 1/133528; G02F 1/133305
See application file for complete search history.

(56) References Cited

U.S. PATENT DOCUMENTS

| | | | | |
|---|---|---|---|---|
| 8,434,369 | B2* | 5/2013 | Hou | G01L 1/18 |
| | | | | 73/718 |
| 8,568,184 | B2* | 10/2013 | Prest | H01L 51/5246 |
| | | | | 445/25 |
| 9,406,698 | B2* | 8/2016 | Yamazaki | H01L 51/5246 |
| 9,714,187 | B2* | 7/2017 | Chang | C04B 35/645 |
| 9,853,237 | B2* | 12/2017 | Lee | H01L 51/524 |
| 9,927,893 | B2* | 3/2018 | Hamada | G06F 1/16 |
| 9,950,505 | B2* | 4/2018 | Qiao | H01L 51/5246 |
| 10,483,210 | B2* | 11/2019 | Gross | C03C 17/326 |
| 10,492,311 | B2* | 11/2019 | Liu | H05K 5/0017 |
| 10,664,014 | B2* | 5/2020 | Cui | G09F 9/301 |
| 10,840,474 | B2* | 11/2020 | Ai | H01L 51/524 |
| 2010/0099323 | A1* | 4/2010 | Zu | H01L 51/5246 |
| | | | | 445/25 |
| 2010/0155247 | A1* | 6/2010 | Cao | C08L 23/22 |
| | | | | 204/600 |
| 2010/0237453 | A1 | 9/2010 | Bonekamp et al. | |
| 2011/0080372 | A1* | 4/2011 | Lee | G06F 3/045 |
| | | | | 345/174 |
| 2011/0273383 | A1* | 11/2011 | Jeon | G06F 3/0443 |
| | | | | 345/173 |
| 2014/0092356 | A1* | 4/2014 | Ahn | G02F 1/1339 |
| | | | | 349/153 |
| 2015/0316803 | A1* | 11/2015 | Zhang | G02F 1/1368 |
| | | | | 156/60 |
| 2017/0062741 | A1* | 3/2017 | Shin | H01L 51/5253 |
| 2017/0139532 | A1* | 5/2017 | Franklin | G06F 3/044 |
| 2017/0237453 | A1 | 8/2017 | Egashira et al. | |
| 2017/0263881 | A1* | 9/2017 | Choi | H05K 3/30 |
| 2017/0343428 | A1* | 11/2017 | Wen | G06F 3/0443 |
| 2018/0188580 | A1* | 7/2018 | Zhang | G06F 3/0447 |
| 2020/0243805 | A1* | 7/2020 | Kishimoto | G02F 1/133308 |
| 2020/0272203 | A1* | 8/2020 | Kim | B32B 7/14 |

FOREIGN PATENT DOCUMENTS

| | | |
|---|---|---|
| CN | 103474580 A | 12/2013 |
| CN | 103928398 A | 7/2014 |
| CN | 104022233 A | 9/2014 |
| CN | 104201189 A | 12/2014 |
| CN | 104576964 A | 4/2015 |
| CN | 104795424 A | 7/2015 |
| CN | 105867546 A | 8/2016 |
| CN | 105977277 A | 9/2016 |
| CN | 106030687 A | 10/2016 |
| CN | 106057864 A | 10/2016 |
| CN | 106653812 A | 5/2017 |
| CN | 107871453 A | 4/2018 |
| KR | 20050048285 A * | 5/2005 |
| KR | 20160111839 A | 9/2016 |
| TW | 200733790 A | 9/2007 |
| WO | 2017/043057 A1 | 3/2017 |

OTHER PUBLICATIONS

Chinese First Office Action for CN Application No. 201711051573.7 dated May 9, 2019.
Chinese First Office Action for CN Application No. 201711051573.7 dated Aug. 30, 2019.
Written Opinion of PCT/CN2018/090924 dated Aug. 22, 2018.
Taiwan First Office Action for Application No. 107123665 dated Jun. 14, 2019.

* cited by examiner

FLEXIBLE DISPLAY MODULE HAVING A FLEXIBLE GLASS LAYER

CROSS-REFERENCE TO RELATED APPLICATIONS

This application is a continuation of International Application No. PCT/CN2018/090924 filed on Jun. 13, 2018, which claims priority to Chinese patent application No. 201711051573.7 filed on Oct. 31, 2017. Both applications are incorporated herein by reference in their entireties.

TECHNICAL FIELD

Embodiments of the present invention relate to the field of display technologies, in particular to a flexible display module and a method for preparing the flexible display module.

BACKGROUND

With the rapid development of display technologies, flexible display panels have been favored by many users due to their advantages of thinness, light weight, resistance to falling, flexibility, energy saving and the like, and have become a hot research topic recently.

The existing flexible display module includes a cover film, a polarizer, a flexible touch screen, a display light emitting device, such as Organic Light Emitting Diode (OLED), and the like. In order to avoid erosion of external water and oxygen to the display light emitting device, Thin Film Encapsulation (TFE) is also needed to be prepared on a surface of a display device.

However, it has been proved by a plurality of experiments that a main failure location of the flexible display module is at a connection between the TFE and the display light emitting device during a bending process. Since a thicker inorganic layer in the TFE is prone to fracture, the TFE and the display light emitting device are stripped with each other, which ultimately make the whole flexible display module invalid.

SUMMARY

In view of this, embodiments of the present invention provide a flexible display module and a method for preparing the flexible display module, which solve a problem that the flexible display module is easy to be invalid after being bent.

A flexible display module according to an embodiment of the present invention includes a flexible glass layer; and a display panel disposed inside the flexible glass layer.

In an embodiment, the flexible glass layer includes a first flexible glass layer with a groove in the middle; and a second flexible glass layer disposed on a surface of the first flexible glass layer. The display panel is disposed in the groove of the first flexible glass layer.

In an embodiment, a size of the groove is larger than a size of the display panel.

In an embodiment, a periphery of the second flexible glass layer and sides of the groove of the first flexible glass layer are encapsulated by a process of laser sintering glass powder.

In an embodiment, the flexible glass layer includes a first flexible glass layer and a second flexible glass layer which is stacked above the first flexible glass layer; and a sealing layer disposed between the first flexible glass layer and the second flexible glass layer. A middle portion of the sealing layer includes a hollow; and the display panel is disposed in the hollow of the sealing layer, and a bottom area size of the hollow is larger than a size of the display panel.

In an embodiment, the flexible glass layer further includes a first silicone oil layer disposed between the display panel and the first flexible glass layer; and/or a second silicone oil layer disposed between the display panel and the second flexible glass layer.

In an embodiment, the sealing layer is bonded to one or both of the first flexible glass layer and the second flexible glass layer by an adhesive layer.

In an embodiment, the sealing layer is made of silicone rubber.

In an embodiment, the display panel includes a binding end configured to form an electrical connection with an external circuit structure. The sealing layer includes a edging frame portion and an opening frame portion, the opening frame portion and the edging frame portion are combined into a frame shape, the edging frame portion is pressed against a surface of the binding end of the display panel, and a binding pin of the binding end is exposed.

In an embodiment, the display panel includes a fixing region fixed to one or both of the first flexible glass layer and the second flexible glass layer; and the fixing region starts from the binding end.

In an embodiment, the sealing layer includes at least one vent and a sealing material configured to seal the vent.

In an embodiment, the sealing layer includes a plurality of the vents respectively disposed in one or both of a predetermined bending region of the flexible display module and an extending direction of a gap between the display panel and the hollow.

In an embodiment, the display panel includes a polarizing layer, a touch layer and a display function layer; and the touch layer includes a third flexible glass layer and a conductive material layer disposed on one side of the third flexible glass layer.

In an embodiment, the conductive material layer is formed by coating a conductive material on the one side of the third flexible glass layer in a coating manner.

In an embodiment, the flexible display module further includes at least one strain barrier layer. The strain barrier layer includes a chamber and an elastic material layer surrounding a periphery of the chamber; and the display panel includes at least two function layers, the at least one strain barrier layer is disposed between any two function layers of the function layers, and/or the at least one strain barrier layer is disposed between the first flexible glass layer and the display panel, and/or the at least one strain barrier layer is disposed between the display panel and the second flexible glass layer.

In an embodiment, the chamber is filled with a gas.

In an embodiment, the gas includes any one or any combination of the following: air and an inert gas.

In an embodiment, the flexible display module further includes a routing region disposed on a second surface of the first flexible glass layer and configured to be electrically connected to the display panel. The display panel is disposed on a first surface of the first flexible glass layer, and the first surface and the second surface are opposite surfaces.

In an embodiment, the first flexible glass layer includes a via hole, and a circuit trace of the routing region electrically connect the display panel with an external circuit through the via hole.

In an embodiment, the display panel includes a substrate, a thin film transistor device layer, an organic light emitting diode device layer, a touch screen, and a polarizer which are sequentially stacked.

In an embodiment, the display panel further includes a thin film encapsulation layer disposed on a surface of the organic light emitting diode device layer.

In an embodiment, the thin film encapsulation layer is prepared by atomic layer deposition, and/or a material of the thin film encapsulation layer is aluminum oxide, and/or a thickness of the thin film encapsulation layer is 25 nm to 50 nm.

A display screen includes any one of the above-mentioned flexible display modules and a frame having a preset curved shape. The flexible display module is disposed in the frame, and a perimeter of the frame is smaller than a perimeter of the flexible display module.

In an embodiment, the frame is attached to a periphery of the flexible display module.

In an embodiment, an inner surface of the frame includes an annular groove.

In an embodiment, a depth of the annular groove is 3 nm to 5 mm.

In an embodiment, a cross-sectional shape of the annular groove is any one of the following: an arc shape, a trapezoidal shape, and a U shape.

A method for preparing a flexible display module according to an embodiment of the present invention includes: preparing or providing a first flexible glass layer with a groove in the middle; disposing a display panel inside the groove of the first flexible glass layer; disposing a second flexible glass layer on the display panel; and encapsulating a periphery of the second flexible glass layer and a side of the groove of the first flexible glass layer.

In an embodiment, the periphery of the second flexible glass layer and the side of the groove of the first flexible glass layer are encapsulated by a process of laser sintering glass powder.

In an embodiment, the display panel includes a substrate, a thin film transistor device layer, an organic light emitting diode device layer, a thin film encapsulation layer, a touch screen, and a polarizer which are sequentially stacked; or the display panel includes the substrate, the thin film transistor device layer, the organic light emitting diode device layer, the touch screen, and a polarizer which are sequentially stacked.

The display panel is encapsulated inside the flexible glass layer by using the flexible display module and the method for preparing the flexible display module according to the embodiments of the present invention, so that even after removing a thin film encapsulation layer which is easy to bend and break in the existing display panel structure, an encapsulation performance can still be satisfied, and erosion of external water and oxygen to the display device of the display panel can also be avoided. At the same time, an excellent bending resistance of a flexible glass itself can meet bending requirements of the flexible display module, which effectively solves the problem that the display panel is prone to fracture failure during the process of the existing flexible display module being bent. In addition, a structural design by which the display panel is encapsulated inside the flexible glass layer, enables the flexible glass layer to disperse stress withstood by the display panel during the process of the existing flexible display module being bent, and further avoids the fracture failure of the display panel during the process of the existing flexible display module being bent.

DETAILED DESCRIPTION

The technical solutions in the embodiments of the present invention are clearly and completely described in the following with reference to the accompanying drawings in the embodiments of the present invention. It is obvious that the described embodiments are only a part of the embodiments of the present invention, and not all of the embodiments. All other embodiments obtained by those skilled in the art based on the embodiments of the present invention without creative efforts are within the scope of the present invention.

Figure 1:
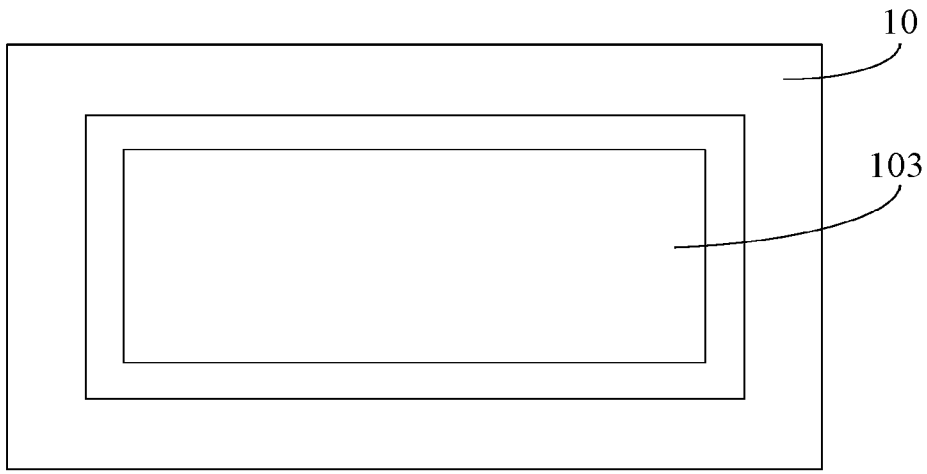
FIG. 1 is a top plan view of a flexible display module according to an embodiment of the present invention.
Figure 1B:
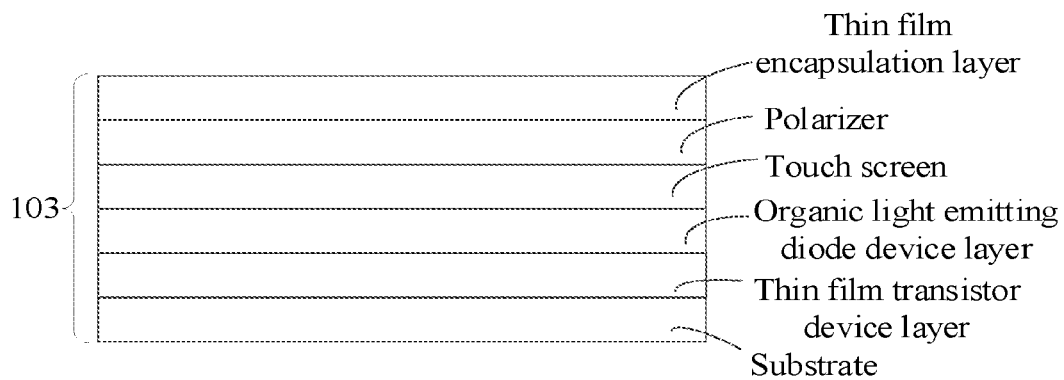
FIG. 1B is a side view of a flexible display module according to an embodiment of the present invention.

FIG. 1 and FIG. 1B show a flexible display module according to an embodiment of the present invention.

The flexible display module includes a flexible glass layer 10; and a display panel 103 disposed inside the flexible glass layer 10.

A flexible glass has bendable properties. After test, the flexible glass layer may withstand 100,000 bending fatigue tests with a bending radius of 5 mm. The display panel 103 refers to a panel that plays a display role in a flexible display module, and may include various types such as Organic Light Emitting Diode (OLED), Electrophoretic Display (EPD), Liquid Crystal Display (LCD) device, Thin Film Transistor (TFT) and the like according to different display principles. In an embodiment of the present invention, a structure of the display panel 103 may include a substrate, a thin film transistor device layer, an organic light emitting diode device layer, a touch screen, a polarizer, and the like, which are sequentially stacked. The specific display manner and a structure of the display panel 103 are not limited in the present invention.

It can be seen that by encapsulating the display panel 103 inside the flexible glass layer 10, even after removing the thin film encapsulation layer which is easy to bend and break in the structure of the existing display panel 103, an encapsulation performance can still be satisfied, and erosion of external water and oxygen to the display device of the display panel 103 can also be avoided. At the same time, an excellent bending resistance of the flexible glass itself can meet bending requirements of the flexible display module. It effectively solves a problem that the display panel 103 is prone to fracture failure during the process of the existing flexible display module being bent. In addition, a structural design by which the display panel is encapsulated inside the flexible glass layer, enables the flexible glass layer 10 to disperse stress withstood by the display panel 103 during the process of the existing flexible display module being bent, and further avoids the fracture failure of the display panel 103 during the process of the existing flexible display module being bent.

Figure 2:
FIG. 2 is a top plan view of a flexible display module according to another embodiment of the present invention.
Figure 3:
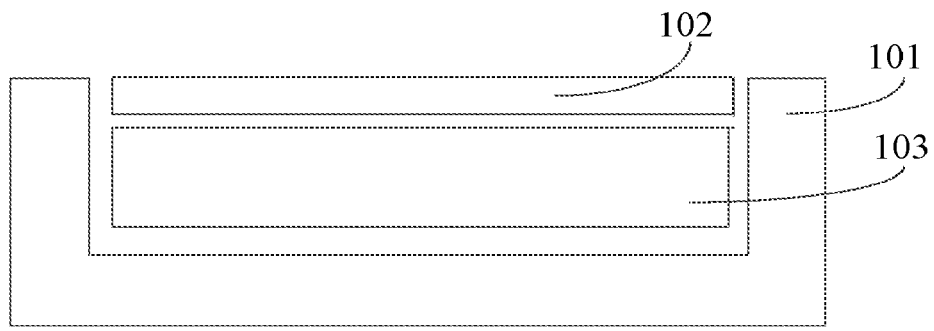
FIG. 3 is a main view of a flexible display module according to an embodiment of the present invention.

FIG. 2 and FIG. 3 are respectively a top plan view and a main view of a flexible display module according to an embodiment of the present invention.

Figure 4:
FIG. 4 is a schematic diagram of a first flexible glass layer with a groove in the middle according to an embodiment of the present invention.

As shown in FIG. 2 and FIG. 3, the flexible display module includes the flexible glass layer 10 composed of a first flexible glass layer 101 and a second flexible glass layer 102. The first flexible glass layer 101 has a groove in the middle, as shown in FIG. 4. The first flexible glass layer 101 with the groove defined in the middle may be prepared by grooving in a piece of a flexible glass by means of etching or the like.

The display panel 103 is disposed inside the flexible glass layer 10, i.e., the display panel 103 is located between the first flexible glass layer 101 and the second flexible glass layer 102, and the display panel 103 is wrapped with the flexible glass.

It should be understood that the first flexible glass 101 with the groove defined therein may be prepared or directly purchased from a glass sales company. The groove may be prepared by a process such as the etching and the like. The source or preparation manner of the first flexible glass 101 with the groove in the middle is not limited in the embodiment of the present invention.

The display panel 103 is disposed in the groove of the first flexible glass layer 101. The display panel 103 may be disposed in the groove of the first flexible glass layer 101 in a bonding manner of an optical glue. Due to the existence of the groove of the first flexible glass layer 101, a sliding range of the second flexible glass layer 102 is effectively limited, and fracture failure of the flexible display module, caused by an excessive positional displacement of the second flexible glass layer 102 during the process of being bent, is prevented.

The second flexible glass layer 102 is disposed on the display panel 103, and the second flexible glass layer 102 is bonded on the display panel 103 by the optical glue. After the second flexible glass layer 102 being bonded on the display panel 103, an upper surface of the second flexible glass layer 102 is coplanar with the upper surface of the first flexible glass layer 101. In an embodiment of the present invention, a cross-sectional area of the groove of the first flexible glass 101 is larger than the cross-sectional area of the display panel 103. The display panel 103 can slide in the groove during the process of the flexible display module being bent, thereby the bending stress is further dispersed and the fracture failure of the display panel 103 is avoided. The second flexible glass layer 102 should be located inside the groove of the first flexible glass layer 101. Due to the first flexible glass layer 101, the second flexible glass layer 102 has been suppressed from sliding, and the bending resistance of the flexible display module is improved.

It should be understood that the manner in which the display panel 103 is disposed in the groove of the first flexible glass 101 may be bonded by the optical glue or by silicone oil or the like. When the display panel is bonded in the groove of the first flexible glass 101 by the silicone oil, the display panel 103 may slide better in the groove, so the bending stress is alleviated. The specific manner and the material which are used in which the display panel 103 is disposed in the groove of the first flexible glass 101 are not limited in the present invention.

Figure 5:
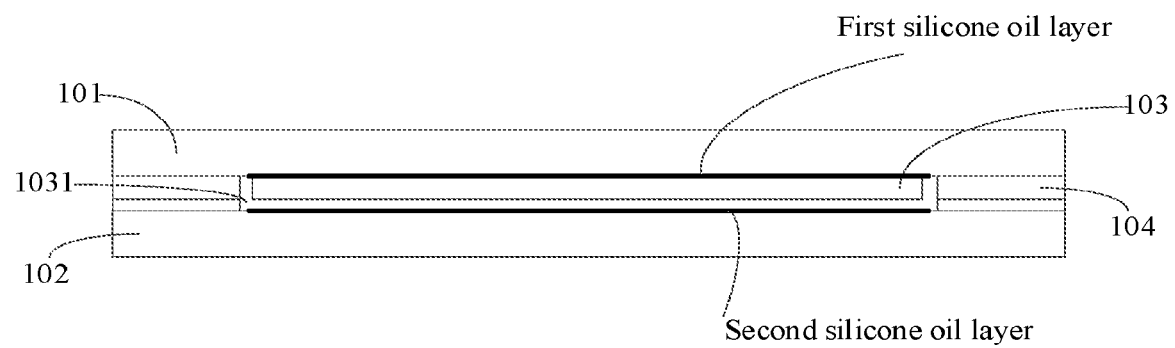
FIG. 5 is a schematic structural diagram of a flexible display module according to an embodiment of the present invention.

FIG. 5 is a schematic structural diagram of a flexible display module according to an embodiment of the present invention. As shown in FIG. 5, the flexible display module includes a first flexible glass layer 101 and a second flexible glass layer 102 stacked on the first flexible glass layer 101, a sealing layer 104 disposed between the first flexible glass layer 101 and the second flexible glass layer 102, and a display panel 103. The sealing layer 104 has a hollow 1031 defined therein. The display panel 103 is disposed in the hollow 1031 of the sealing layer 104. A bottom surface area of the hollow 1031 is larger than a size of the display panel 103.

It can be seen that a substrate and a cover in the existing flexible display module are replaced by the flexible glass layer in the embodiment of the present invention. Since the flexible glass itself has excellent stiffness and the bending resistance performance, a problem that the existing flexible display module has a demand contradiction between the stiffness and prevention film stratification may be effectively solved. Meanwhile, since the display panel 103 is disposed in the hollow 1031 between the first flexible glass layer 101 and the second flexible glass layer 102, and the bottom area size of the hollow 1031 is larger than the size of the display panel 103. When the display panel 103 is bent, the display panel 103 may slide, relative to the first flexible glass layer 101 and the second flexible glass layer 102, in the hollow 1031, thereby the bending stress is alleviated, the film stratification inside the display panel 103 is effectively avoided, the bending resistance performance of the flexible display module is further improved, and the reliability of products is improved.

It should be understood that the specific shape of the hollow 1031 of the sealing layer 104 may be adjusted according to a shape of the display panel 103. Generally, a size of the hollow 1031 is only slightly larger than a size of the display panel 103 and a shape of the hollow 1031 is same as a shape of the display panel 103. For example, when a shape of the display panel 103 is rectangular, a shape of the hollow 1031 in the sealing layer 104 may also be rectangular, and the size of the bottom surface area of the hollow 1031 is larger than the size of the display panel 103, so that the display panel 103 slides in the hollow 1031 during the flexible display module being bent. The specific shape of the hollow 1031 of the sealing layer 104 is not limited in the present invention.

In an embodiment of the present invention, in order to make the sliding of the display panel 103 in the hollow 1031 more flexible and smooth during the flexible display module being bent, a first silicone oil layer may be disposed between the display panel 103 and the first flexible glass layer 101, and/or a second silicone oil layer is disposed between the display panel 103 and the second flexible glass layer 102. However, it should be understood that even if there is no the first silicone oil layer and the second silicone oil layer, the display panel 103 may also slide in the hollow 1031. Whether the flexible display module includes the first silicone oil layer and the second silicone oil layer is not limited in the present invention.

In an embodiment of the present invention, the sealing layer 104 is bonded to one or both of the first flexible glass layer 101 and the second flexible glass layer 102 by an adhesive layer. A material of the adhesive layer may be a Transparent Optical Adhesive (OCA). However, the specific material of the adhesive layer is not limited in the present invention.

In an embodiment of the present invention, the sealing layer 104 may be made of silicone rubber. The silicone rubber may deform elastically with the change of bending stress, and has a good bending resistance performance and a sealing performance. However, it should be understood that the sealing layer 104 may also be made of other sealing materials, and the specific material of the sealing layer 104 is not limited in the present invention.

Figure 6:
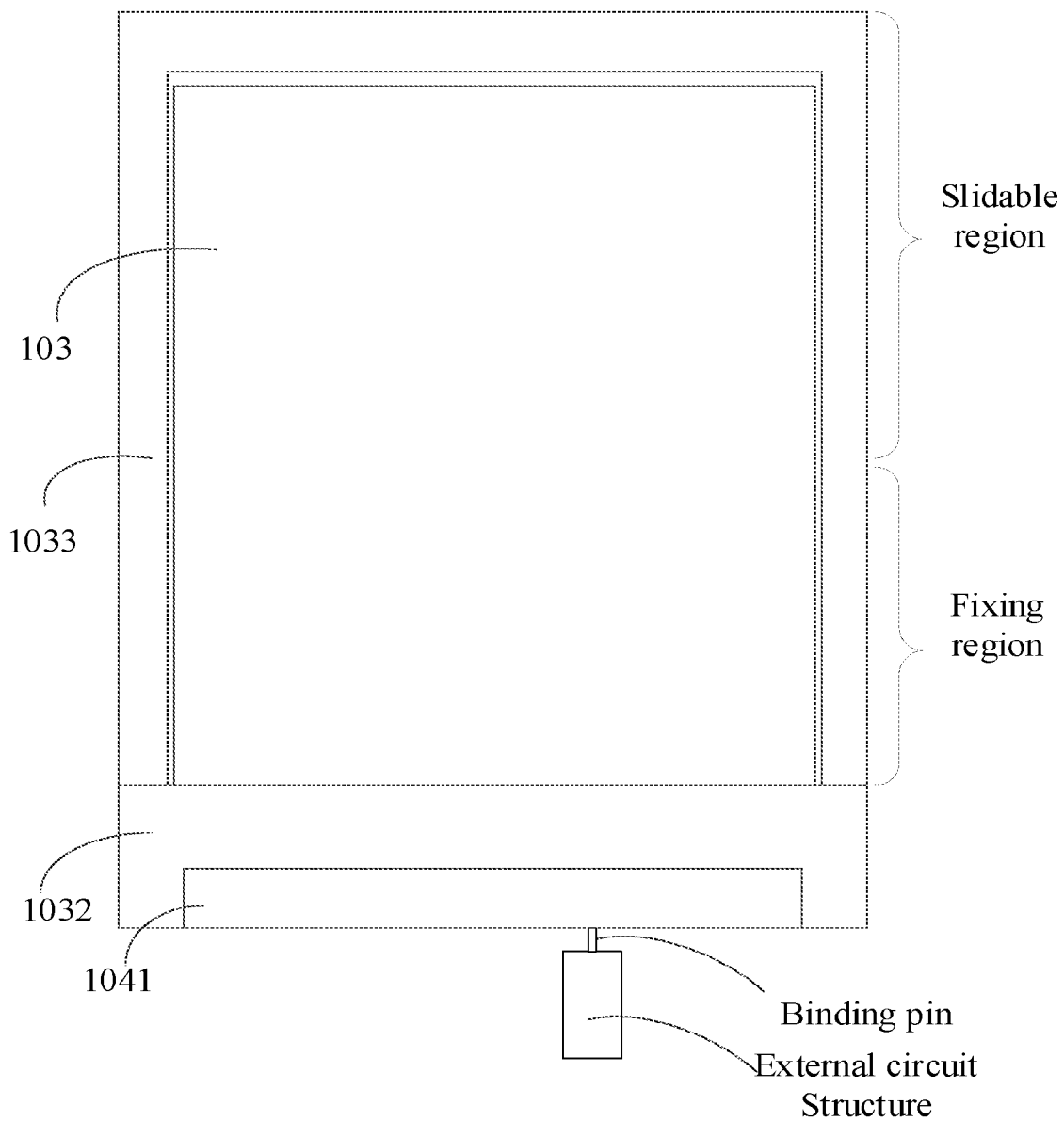
FIG. 6 is a schematic structural diagram of a flexible display module according to another embodiment of the present invention.

FIG. 6 is a schematic structural diagram of a flexible display module according to another embodiment of the present invention. As shown in FIG. 6, the display panel 103 of the flexible display module includes a binding end 1041 configured to form an electrical connection with an external circuit structure. In this case, in the process of preparing the flexible display module, the sealing layer 104 with an integral frame type cannot meet the requirement that the display panel 103 is electrically connected to the external structure through the bonding end 1041, the sealing layer 104 includes an edging frame portion 1032 and an opening frame portion 1033 separated from the edging frame portion 1032. The opening frame portion 1033 and the frame portion 1032 are assembled into a frame shape. Therefore, when the sealing layer 104 is prepared, the opening frame portion 1033 is prepared first, and after the display panel 103 is attached to an opening region of the opening frame portion 1033, the edging frame portion 1032 is pressed against a surface of the binding end 1041 of the display panel 103, and a binding pin of the binding end 1041 is exposed.

In an embodiment of the present invention, the display panel 103 may include a fixed region which is fixed to one or both of the first flexible glass layer 101 and the second flexible glass layer 102, and a slidable region which slides relative to the first flexible glass layer 101 and the second flexible glass layer 102. The fixed region starts from the binding end 1041. For example, when the sealing layer 104 includes the edging frame portion 1032 and the opening frame portion 1033 separated from the edging frame portion 1032. The edging frame portion 1032 can press fit the binding end 1041 of the display panel 103 against the first flexible glass layer 101. Thus, the binding end 1041 of the display panel 103 is in a fixed state relative to the first flexible glass layer 101, and the slidable region of the display panel 103 is in a slidable state of the slidable region of the display panel 103 sliding relatively to the first flexible glass layer 101 and the second flexible glass layer 102. When the flexible display module is bent, the fixed region in the fixed state will remain be fixed, and the slidable region in the slidable state can relieve the bending stress by sliding, which can avoid the film inside the display panel 103 being fractured.

However, it should be understood that although in the embodiment shown in FIG. 6, the fixed region starts from the binding end 1041 and extends to one-half of the area of the display panel 103. As long as a region in the slidable state may relieve the bending stress by sliding, the specific size of the fixed region is not strictly limited in the present invention, and the size, position and shape of the fixed region may be adjusted according to actual scene requirements.

Figure 7:
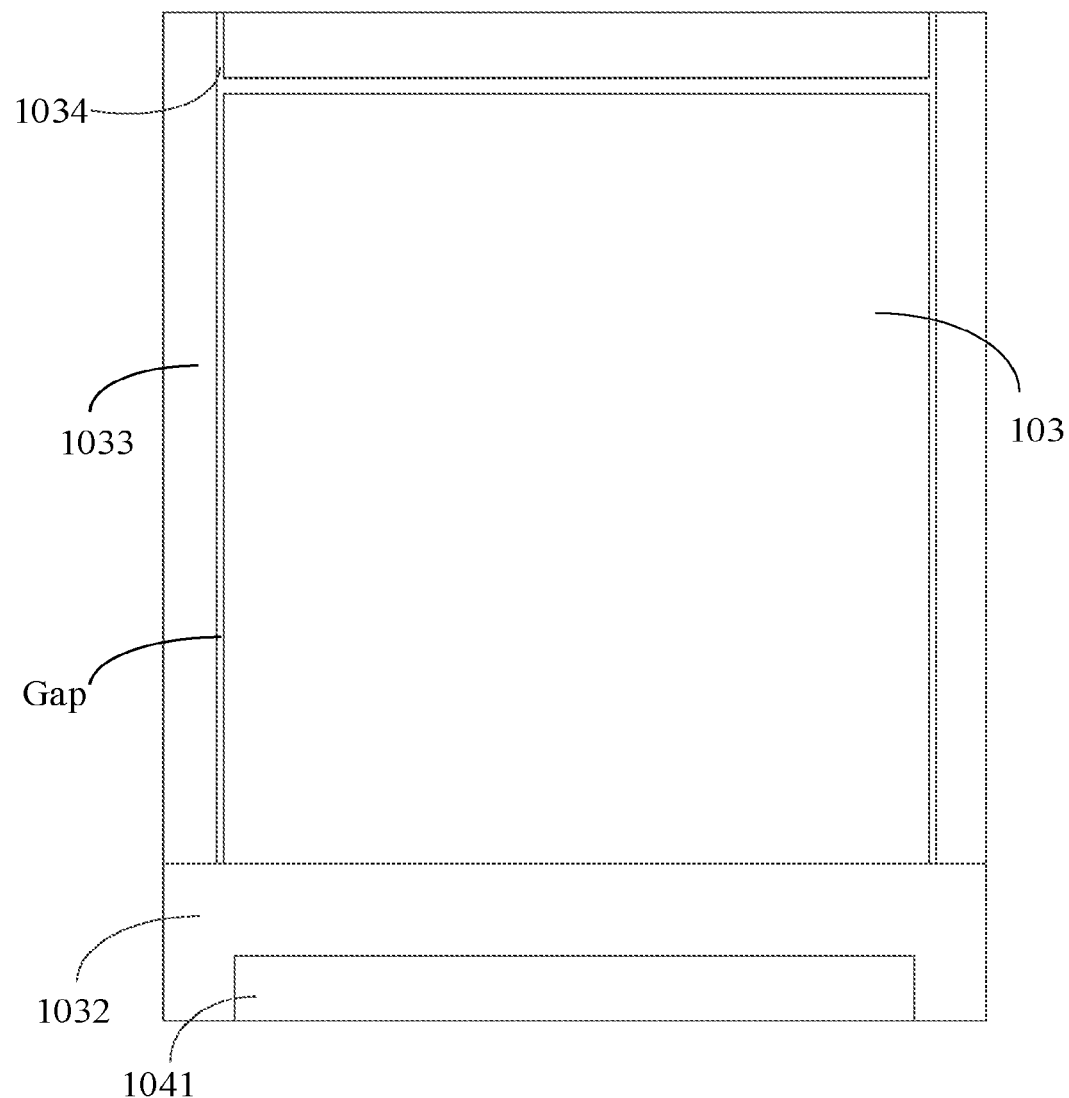
FIG. 7 is a schematic structural diagram of a flexible display module according to still another embodiment of the present invention.

FIG. 7 is a schematic structural diagram of a flexible display module according to another embodiment of the present invention. As shown in FIG. 7, the sealing layer 104 of the flexible display module includes at least one vent 1034 and a sealing material configured to seal the vent 1034. In a process of the sealing layer 104 being bonded with the second flexible glass layer 102, air bubbles generated during the process can be exported by the vents 1034, which can prevent the air bubbles from existing between the second flexible glass layer 102 and the display panel 103. After the process of the sealing layer 104 being bonded with the second flexible glass layer 102 is completed, the at least one vent 1034 is sealed with the sealing material.

In an embodiment of the invention, the sealing layer 104 may include a plurality of vents 1034, which may be respectively disposed in one or both of a predetermined bending region of the flexible display module and an extending direction of a gap between the display panel 103 and the hollow 1031. For example, when a shape of the display panel 103 is rectangular, the vent 1034 may be disposed in an imagined line extending along the extending direction of a longitudinal slit between the display panel 103 and the hollow 1031 (as shown in FIG. 4) and an imagined line extending along the extending direction of a transverse slit between the display panel 103 and the hollow 1031. A main effect of the vents 1034 is to prevent the bonding (as shown in FIG. 5) or the predetermined bending region (as shown in FIG. 6). Thus, the second flexible glass layer 102 may be bonded on a surface of the sealing layer 104 along a direction in which the vents 1034 extend outward, which can export the air bubbles during the second flexible glass layer 102 being bonded on a surface of the sealing layer 104. However, it should be understood that the specific arrangement positions of the vents 1034 may be adjusted according to the actual scene requirements, and the specific arrangement position, position combination and number of the vents 1034 are not strictly limited in the present invention.

Figure 8:
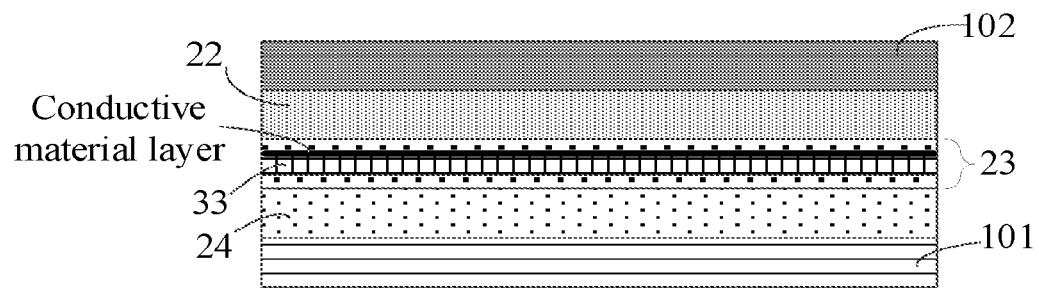
FIG. 8 is a schematic structural diagram of a flexible display module according to yet still another embodiment of the present invention.

FIG. 8 is a schematic structural diagram of a flexible display module according to a first embodiment of the present invention. As shown in FIG. 8, the flexible display module according to the first embodiment of the present invention includes a second flexible glass layer 102, a polarizing layer 22, a touch layer 23, a display function layer 24, and a first flexible glass layer 101 which are sequentially stacked from top to bottom. The touch layer 23 includes a third flexible glass layer 33 and a conductive material layer (not shown) coated to one side of the third flexible glass layer 33. As can be seen, in the embodiment shown in FIG. 11, the display panel 103 includes the polarizing layer 22, the third flexible glass layer 33, the conductive material layer and the display function layer 24. It should be understood that the display function layer 24 can be an OLED function layer or other film layers which have display function.

How the conductive material layer being coated to one side of the third flexible glass layer 33 includes the following two situations.

In a first situation, the conductive material layer in the touch layer 23 is coated to an upper surface of the third flexible glass layer 33 (the upper surface shown in FIG. 2), and at this time, the third flexible glass layer 33 in the touch layer 23 is contact directly with the display function layer 24.

The third flexible glass layer 33 that is contact directly with the display function layer 24 needs to be fixed by means of an adhesive layer. In addition, in order to sufficiently prevent substances such as water and oxygen from destroying the display function layer 24, it is necessary to perform an encapsulation operation on a periphery of the adhesive layer between the third flexible glass layer 33 and the display function layer 24 to form an encapsulation layer. The encapsulation layer is disposed along the periphery of the adhesive layer that is not in contact with other film layers of a flexible substrate.

In a second situation, the conductive material layer in the touch layer 23 is coated to a bottom surface of the third flexible glass layer 33 (the bottom surface as shown in FIG. 2). At this time, the conductive material layer coated to the third flexible glass layer 33 is formed between the third flexible glass layer 33 in the touch layer 23 and the display function layer 24. In addition, in order to firmly adhere, an adhesive layer (not shown) should be further formed between the touch layer 23 and the display function layer 24, i.e., the adhesive layer is disposed between the conductive material layer and the display function layer 24. And an encapsulation operation of the conductive material layer and the adhesive layer is performed to form an encapsulation layer, and the encapsulation layer is disposed along the periphery of the adhesive layer that is not in contact with other film layers of a flexible substrate, which sufficiently prevent substances such as water and oxygen from destroying the display function layer 24.

The flexible substrate provided by the first embodiment of the present invention is coated to the third flexible glass layer 33 by a coating process to form a conductive material layer, and the third flexible glass layer 33 coated with the conductive material layer is stacked with other film layers to form the flexible substrate, which reduces a thickness of the flexible substrate, the number of the film layers, and probability of film stratification during the flexible display module being bent.

Figure 9:
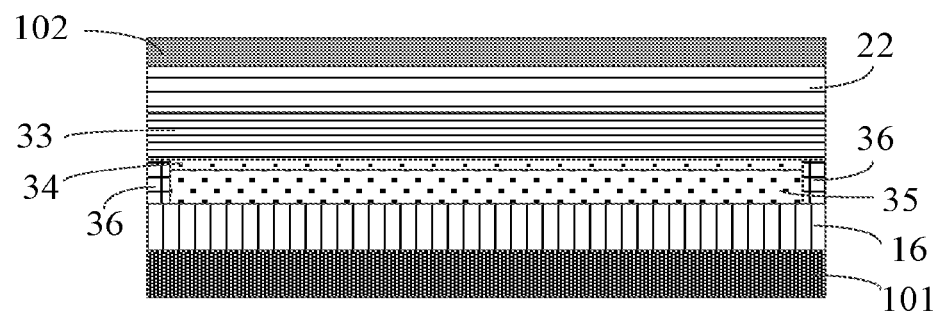
FIG. 9 is a schematic structural diagram of a flexible display module according to still another embodiment of the present invention.

FIG. 9 is a schematic structural diagram of a flexible display module according to a second embodiment of the present invention. As shown in FIG. 9, the flexible display module according to the second embodiment of the present invention includes a second flexible glass layer 102, a polarizing layer 22, an ultra-thin glass layer 33, an ITO (conductive material) layer 34, a pressure-sensitive adhesive layer 35, an OLED layer 16, a first flexible glass layer 101, a water and oxygen barrier rubber layer 36 disposed along a periphery of the ITO layer 34 and the pressure-sensitive adhesive layer 35 not in contact with the other film layers of the flexible substrate which are sequentially stacked from top to bottom. The water and oxygen barrier rubber layer 36 is provided to sufficiently prevent the OLED layer 16 from being destroyed by substances such as water and oxygen.

Figure 10:
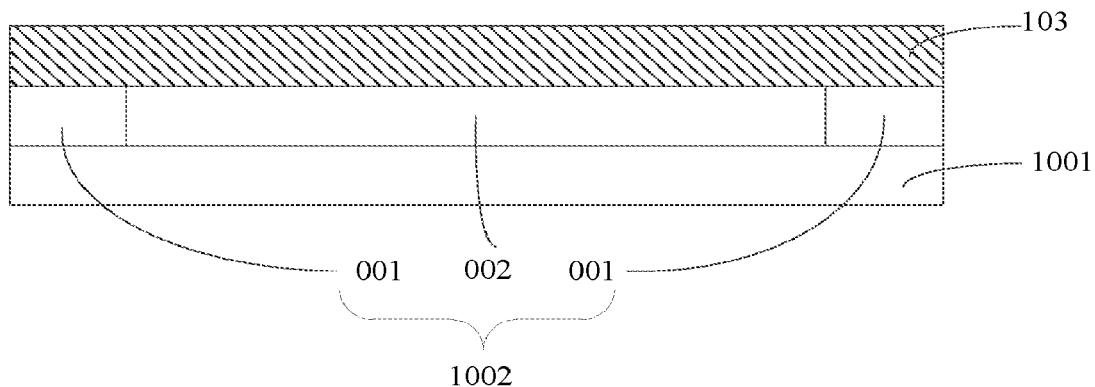
FIG. 10 is a schematic structural diagram of a flexible display module according to yet still another embodiment of the present invention.

FIG. 10 is a schematic structural diagram of a flexible display module according to an embodiment of the present invention.

As shown in FIG. 10, the flexible display module according to the embodiment of the present invention includes: a first module material layer 1001, a second module material layer 1003 disposed on the first module material layer 1001, and at least one strain barrier layer 1002 disposed between the first module material layer 1001 and the second module material layer 1003. The strain barrier layer 1002 includes a chamber 002 and an elastic material layer 001 surrounding a periphery of the chamber.

It should be understood that the module material layer is a function unit composing the flexible display module, and each of the module material layer may also be composed of a plurality of function layers. For example, the module material layer may be the first flexible glass layer 101, the second flexible glass layer 102, or the function layer in the display panel 103 (e.g., a substrate, a thin film transistor device layer, an organic light emitting diode device layer, a touch screen, and a polarizer). In order to distinguish different module material layers, qualifiers such as the first and the second, are introduced in the embodiment of the present invention, such as the first module material layer 1001 and the second module material layer 1003.

In the flexible display module provided by the embodiment of the present invention, a strain barrier layer 1002 is disposed between the first module material layer 1001 and the second module material layer 1003. Since the strain barrier layer 1002 can effectively block strain of the first module material layer 1001 and the second module material layer 1003, the strain transferring between the first module material layer 1001 and the second module material layer 1003 can be effectively prevented when the flexible display module is bent, and the strain of the first module material layer 1001 and the second module material layer 1003 can be reduced, thus the bending resistance performance of the flexible display module is significantly improved and the reliability of products is improved.

It should be understood, however, that the flexible display module of the present invention is not limited to include only the first module material layer 1001 and the second module material layer 1003 shown in FIG. 10, and may also include more module material layers. The strain barrier layer 1002 may be disposed between two adjacent module material layers. The number of module material layers and which two adjacent module material layers are provided with the strain barrier layer 1002 are not specifically limited in embodiment of the present invention.

In one embodiment, the chamber 002 may be filled with one of a gas, a liquid (such as silicone oil) and a vacuum which play a function role in strain barrier. However, when the chamber 002 is filled with a gas, the air pressure inside and outside the chamber 002 may be balanced.

In one embodiment, the gas may be any one or any combination of air and an inert gas. The air resources are abundant and convenient to collect, and the air filled in the chamber 002 may reduce overall preparing cost of the flexible display module. The gas may also be the inert gas, and since chemical properties of the inert gas are stable and are difficult to chemically react with the substance, the use of the inert gas in the chamber 002 can increase the service life of the flexible display module. However, it should be understood that the kind of gas in the chamber 002 is not specifically limited the embodiment of the present invention.

Figure 11:
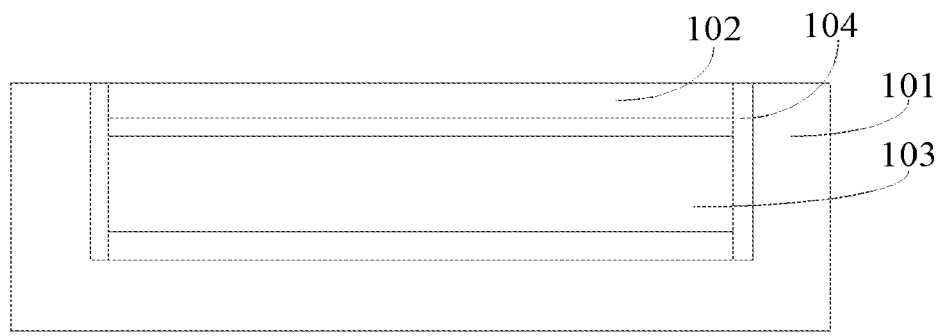
FIG. 11 is a schematic diagram of a flexible display module according to an embodiment of the present invention.

In an embodiment of the present invention, a periphery of the second flexible glass layer 102 and a side of the groove of the first flexible glass layer 101 are encapsulated by a process of laser sintering glass powder. The encapsulated sealing layer 104 is as shown in FIG. 11. The sealing layer 104 which has been laser sintered fills a gap between the periphery of the second flexible glass layer 102 and the side of the groove of the first flexible glass layer 101, thereby external water and oxygen has been prevented from entering an inner of the display panel 103. An upper surface of the display panel 103, which has been encapsulated, is covered with the second flexible glass layer 102, a lower surface and the side of the display panel 103 are covered with a protection of the first flexible glass layer 101, and a periphery of the display panel 103 is protected by the sealing layer 104, which effectively block entry of moisture and oxygen and improve the water and oxygen barrier performance of the flexible display module.

In addition, in a practical application scenario, the display panel 103 may also need to be electrically connected to an external circuit structure through a conductive wire, which may be done by perforating the surface (either side, top or bottom) of the flexible glass layer 10, and then filling holes with a conductive material to form the conductive wire which is electrically connected to the display panel 103, a gap between the conductive material and the holes may be sealed with a sealing material. Alternatively, a conductive film extending to an outer surface of the first flexible glass layer 101 may be first coated on the side of the groove of the first flexible glass layer 101, and the conductive film is etched into a pattern of the conductive wire, and then the second flexible glass layer 102 may be encapsulated with the first flexible glass layer 101. However, it should be understood that the display panel 103 encapsulated in the flexible glass layer 10 may also form an electrical connection with the external circuit structure by other means, but the specific structure and formation manner of the conductive wire are not limited in the present invention.

Figure 12:
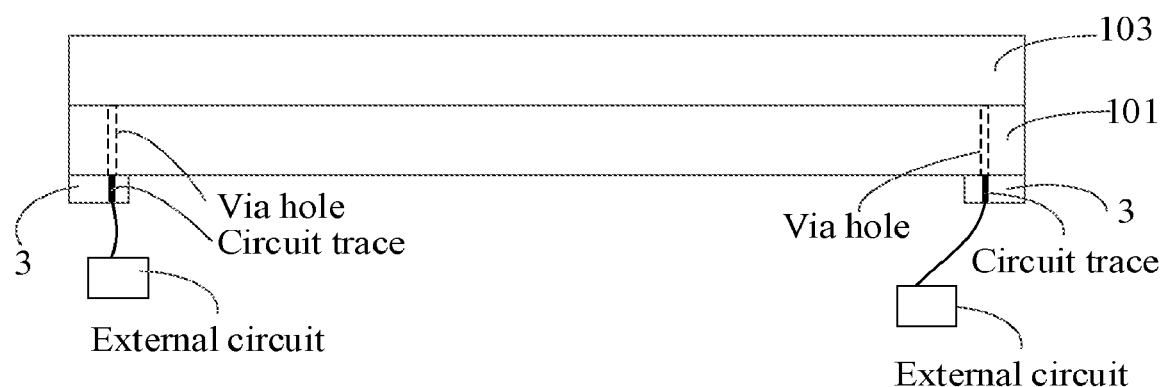
FIG. 12 is a schematic structural diagram of a flexible display module according to an embodiment of the present invention.

FIG. 12 is a schematic structural diagram of a flexible display module according to an embodiment of the present invention. As shown in FIG. 12, in addition to the first flexible glass layer 101, the second flexible glass layer 102, and the display panel 103 disposed on the first surface of the first flexible glass layer 101 which are mentioned in the preceding embodiments, the flexible display module further includes a routing region 3 disposed on the second surface of the first flexible glass layer 101. The second surface is a surface opposite to the first surface, and the routing region 3 is electrically connected to the first surface of the display panel 103.

In this embodiment, the first surface of the first flexible glass layer 101 is a front surface on which a TFT array layer, an anode layer, an organic light emitting layer, a cathode layer and the like may be sequentially disposed, and these function layers collectively constitute the display panel 103 and become a display region of the display device. The second surface of the first flexible glass layer 101 is a back surface, and the routing area 3 is disposed as a non-display portion at a corresponding position on the back surface of the first flexible glass layer 101, such as an edge region of a periphery, which greatly reduces an area of a non-display region on the front surface of the device, so that the device may achieve an effect of a narrow bezel or even a full screen display.

In the display device according to the embodiment, the routing region of the non-display portion is disposed on the back surface of the substrate, so that a routing function may be completed by electrically connecting the non-display region of the front surface of the OLED module, meanwhile greatly reducing an area of the non-display region on the front surface of the display device so that the device may achieve an effect of a narrow bezel or even a full screen display, thereby enhancing the display effect of the screen and improving the user's visual experience.

In an embodiment of the present invention, the first flexible glass layer 101 includes a via hole, and a circuit trace of the routing region 3 may be connected to the display panel 103 which is in a front through the via hole on the first flexible glass layer 101. Specifically, a structure of the via hole may be set one-to-one correspondence with the circuit trace, or one via hole is set to correspond to a plurality of circuit traces, or one via hole corresponds to all circuit traces. For formation of the via hole, the formation of the via hole may be achieved by laser or chemical method, and a hole wall may be evaporated with various conductive media such as copper. Thus, the circuit trace of the routing region 3 on back of the first flexible glass layer 101 may be electrically connected with the display panel 103 on the front through a hole.

In an embodiment of the present invention, the display panel 103 further includes a thin film encapsulation layer disposed on a surface of the organic light emitting diode of the display panel 103. By further providing the thin film encapsulation layer, the organic light emitting diode of the display panel 103 is further ensured not to contact with the air, and water and oxygen barrier performance is improved.

In an embodiment of the present invention, the thin film encapsulation layer may be a alumina layer prepared on a surface of the organic light emitting diode by an atomic precipitation technology. However, it should be understood that a material of the thin film encapsulation layer may also be other encapsulation materials such as zirconia, and the specific preparation process may also adopt other thin film preparation processes. The present invention does not limit the specific material type and the preparation method of the thin film encapsulation layer.

In an embodiment of the present invention, in order to ensure that the thin film encapsulation layer is not easy to be broken during the flexible display module being bent, a preparation thickness of the thin film encapsulation layer needs to be thin enough. For example, the thickness of the thin film encapsulation layer may be 25 nm to 50 nm, but the specific thickness of the thin film encapsulation layer is not limited by the present invention.

It should be understood that in the embodiments of the present invention, the display panel 103 may include or does not include the thin film encapsulation layer, and the present invention does not limit whether the display panel 103 includes the thin film encapsulation layer.

In an embodiment of the present invention, when the final display screen product to be prepared needs a preset curved surface shape (e.g., a 2.5D curved surface with a plane in the middle and a curved surface in a periphery, or a 3D curved surface with a curved surface in the middle and periphery), a frame with the preset curved surface shape may be prepared first, and then the flexible display module according to the embodiment of the present invention may be installed in the frame. A perimeter of the frame may be smaller than that of the flexible display module. The flexible display module itself has a bending resistance performance. When the flexible display module is installed in the frame with a smaller perimeter than the flexible display module, the flexible display module is curved from the plane to the curved surface.

In one embodiment, installing the flexible display module into the frame may include: bonding the frame to whole circumference of the flexible display module in a bonding manner. In order to ensure a more secure installation of the flexible display module, an annular groove may be provided on an inner surface of the frame.

A depth of the annular groove is preferably 3 nm to 5 mm, which can ensure that the installation is reliable and the frame is not too thick. A width of the annular groove may be equal to a thickness of the flexible display module. A section shape of the annular groove may be any one of U-shaped, arc-shaped and trapezoidal. However, the depth, width and shape of the annular groove are not strictly limited the present invention.

Figure 13:
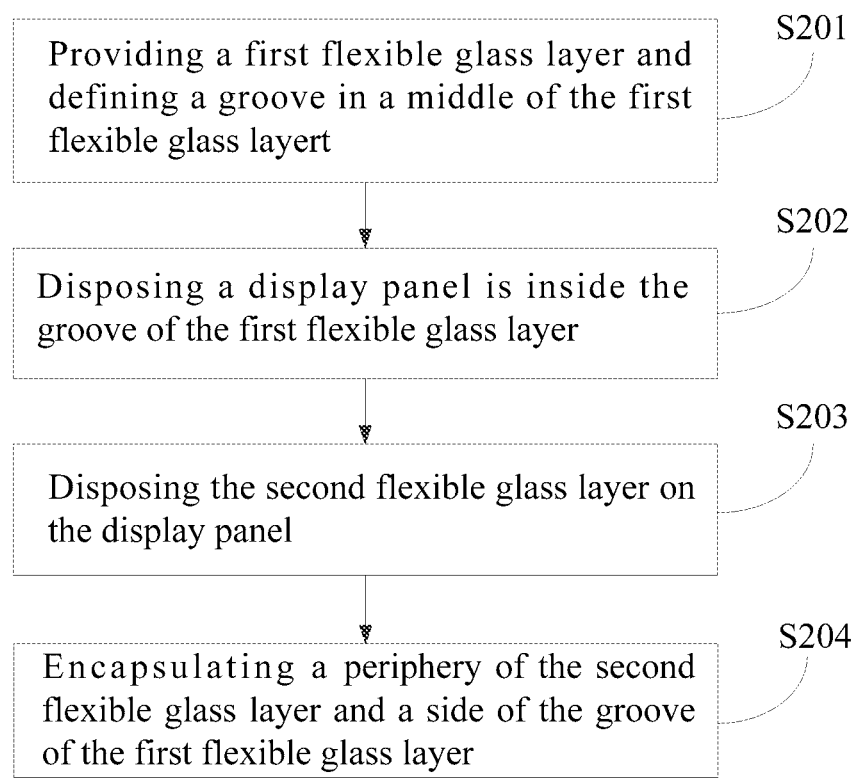
FIG. 13 is a schematic flowchart of a method for preparing a flexible display module according to an embodiment of the present invention.

FIG. 13 is a schematic flowchart of a method for manufacturing a flexible display module according to an embodiment of the present invention. As shown in FIG. 13, the method includes the following method steps.

S201: providing a first flexible glass layer 101 and defining a groove in a middle of first flexible glass layer 101;

The first flexible glass layer 101 has good bendability characteristics. It should be understood that the first flexible glass layer 101 may be prepared or directly purchased from a third party, and the source of the first flexible glass layer 101 is not limited by the present invention.

S202: disposing a display panel 103 inside the groove of the first flexible glass layer 101;

A bottom of the display panel 103 is disposed at a bottom of the groove of the first flexible glass layer 101. A cross-sectional area of the groove of the first flexible glass 101 is larger than a cross-sectional area of the display panel 103, so that the display panel 103 may slide in the groove during the bending process of the flexible display module, thereby further dispersing the bending stress and avoiding fracture failure of the display panel 103. It should be understood that the bottom of the display panel 103 may be disposed at the bottom of the groove of the first flexible glass layer 101 by means of optical glue bonding or silicone oil bonding, and when the display panel 103 is disposed at the bottom of the groove of the first flexible glass layer 101 by the silicone oil bonding, the display panel 103 may be better slid in the groove to alleviate the bending stress, but the specific arrangement and bonding materials are not limited in the present invention.

S203: disposing the second flexible glass layer 102 on the display panel 103.

A lower surface of the second flexible glass layer 102 is disposed on an upper surface of the display panel 103, and after the second flexible glass layer 102 being disposed on an upper surface of the display panel 103, the upper surface of the second flexible glass layer 102 should be kept coplanar with the upper surface of the first flexible glass layer 101. The second flexible glass layer 102 should be located in the groove of the first flexible glass layer 101. Due to the first flexible glass layer 101, the sliding of the second flexible glass layer 102 is effectively suppressed, and the bending resistance performance of the flexible display module is improved.

It should be understood that the second flexible glass layer 102 may be set on the display panel 103 by the means of the optical glue bonding or the silicone oil bonding. When the display panel 103 is bonded with the silicone oil bonding, the display panel 103 may slide better relative to the flexible glass layer 102 to alleviate the bending stress. However, the specific setting method and the bonding material which is used are not limited in the present invention.

S204: encapsulating a periphery of the second flexible glass layer 102 and a side of the groove of the first flexible glass layer 101.

After the display panel 103 have been encapsulated by a laser sintered glass powder, due to the first flexible glass layer 101 and the second flexible glass layer 102, the bending stress withstood by the sealing layer 104 is effectively relieved during the flexible display module being bent, thereby fracture and shearing problems of the brittle sealing layer 104 during the flexible display module being bent are slowed.

After the encapsulation is completed, the upper surface of the display panel 103 is protected by the second flexible glass layer 102, the lower surface of the display panel 103 is protected by the first flexible glass layer, and a periphery of the display panel 103 is protected by the sealing layer 104, which greatly reduces an exposed area of the display substrate in the air, and therefore, a water oxygen barrier efficiency is high. Because of the groove defined in the first flexible glass, the sliding of an upper glass is effectively restrained, and thus the bending resistance performance is better.

In an embodiment of the present invention, the display panel 103 includes: a substrate, a thin film transistor device layer, an organic light emitting diode device layer, a thin film encapsulation layer, a touch screen, and a polarizer which are sequentially stacked; or includes: the substrate, the thin film transistor device layer, the organic light emitting diode device layer, the touch screen, and a polarizer which are sequentially stacked.

The thin film encapsulation layer may be provided on a surface of the organic light emitting diode of the display panel 103. The thin film encapsulation layer is provided on the surface of the organic light emitting diode of the display panel 103 by atomic layer deposition. However, it should be understood that the thin film encapsulation layer may be provided by the atomic layer deposition, but the present invention does not limit the specific method for preparing the thin film encapsulation layer. It should also be understood that a material of the thin film encapsulation layer may be aluminum oxide or zirconia, but the specific material type of the thin film encapsulation layer is not limited in the present invention. It should also be understood that a thickness of the thin film encapsulation layer may be 25 nm to 50 nm, but the specific thickness of the thin film encapsulation layer is not limited in the present invention.

Since the thin film encapsulation layer is prepared, the organic light emitting diode of the display panel 103 reduces an area exposed to the air, thereby improving the water and oxygen barrier efficiency.

It should be understood that the display panel 103 may include the thin film encapsulation layer or may not include the thin film encapsulation layer. Whether the display panel 103 includes the thin film encapsulation layer is not limited in the present invention.

It can be seen that, the display panel 103 is encapsulated inside the flexible glass layer 10 by using the flexible display module prepared by the embodiment of the present invention, so that even after removing the thin film encapsulation layer which is easily bent and broken in a structure of the existing display panel 103, an encapsulation performance still can be satisfied, and the erosion of the display device of the display panel 103 by the external water and oxygen can also be avoided. At the same time, the excellent bending resistance performance of the flexible glass itself can meet bending requirements of the flexible display module, thereby effectively solving a problem that the display panel 103 is prone to breakage during the existing flexible display module being bent. In addition, this structural design enables the flexible glass layer 10 to disperse the stress withstood by the display panel 103 during the flexible display module being bent, the fracture failure of the display panel 103 during the flexible display module being bent is further avoided.

The above are only the preferred embodiments of the present invention, and are not intended to limit the scope of the present invention. Any modifications, equivalent replacements, improvements, etc. made within the spirit and principles of the present invention should be included within the scope of the present invention.

What is claimed is:

1. A flexible display module, comprising:
a flexible glass layer; and
a display panel disposed inside the flexible glass layer;
wherein the flexible glass layer further comprises:
   a first flexible glass layer defining a groove, the display panel being disposed in the groove of the first flexible glass layer; and
   a second flexible glass layer disposed in the groove of the first flexible glass layer.

2. The flexible display module of claim 1, wherein a size of the groove is larger than a size of the display panel; and a periphery of the second flexible glass layer and sides of the groove of the first flexible glass layer are encapsulated by a process of laser sintering glass powder.

3. The flexible display module of claim 1, wherein the flexible glass layer further comprises:
   a first flexible glass layer and a second flexible glass layer stacked above the first flexible glass layer; and
   a sealing layer disposed between the first flexible glass layer and the second flexible glass layer,
   wherein a middle portion of the sealing layer comprises a hollow; and the display panel is disposed in the hollow of the sealing layer, and an area of a bottom of the hollow is larger than that of the display panel.

4. The flexible display module of claim 3, wherein the flexible glass layer further comprises:
   a first silicone oil layer disposed between the display panel and the first flexible glass layer; and/or
   a second silicone oil layer disposed between the display panel and the second flexible glass layer.

5. The flexible display module of claim 3, wherein the sealing layer is bonded to one or both of the first flexible glass layer and the second flexible glass layer by an adhesive layer, and the sealing layer is made of silicone rubber.

6. The flexible display module of claim 3, wherein the display panel comprises a binding end forming an electrical connection with an external circuit structure,
   wherein the sealing layer comprises an edging frame portion and an opening frame portion, the opening frame portion and the edging frame portion are formed into a frame shape, the edging frame portion is pressed against a surface of the binding end of the display panel, and the binding end has a binding pin exposed outwardly.

7. The flexible display module of claim 6, wherein the display panel comprises a fixing region fixed to one or both of the first flexible glass layer and the second flexible glass layer, the fixing region extending from the binding end.

8. The flexible display module of claim 4, wherein the sealing layer comprises at least one vent and a sealing material sealing the vent; or
   the sealing layer comprises a plurality of vents respectively disposed in one or both of a predetermined bending region of the flexible display module and an extending direction of a gap between the display panel and the hollow.

9. The flexible display module of claim 1, wherein the display panel comprises a polarizing layer, a touch layer and a display function layer; and the touch layer comprises a third flexible glass layer and a conductive material layer disposed on one side of the third flexible glass layer.

10. The flexible display module of claim 9, wherein the conductive material layer is formed by coating a conductive material on the one side of the third flexible glass layer in a coating manner.

11. The flexible display module of claim 10, further comprising at least one strain barrier layer;
   wherein the strain barrier layer comprises a chamber and an elastic material layer surrounding a periphery of the chamber;
   the display panel comprises at least two function layers, the at least one strain barrier layer is disposed between two function layers of the function layers, and/or the at least one strain barrier layer is disposed between the first flexible glass layer and the display panel, and/or the at least one strain barrier layer is disposed between the display panel and the second flexible glass layer.

12. The flexible display module of claim 11, wherein the chamber is filled with a gas, and the gas comprises any one or any combination of the following: air and an inert gas.

13. The flexible display module of claim 1, further comprising a routing region disposed on a second surface of the first flexible glass layer for electrically connecting to the display panel;
   the display panel is disposed on a first surface of the first flexible glass layer, and the first surface and the second surface are opposite.

14. The flexible display module of claim 1, wherein the first flexible glass layer comprises a via hole, and a circuit trace of the routing region electrically connects the display panel with an external circuit via the via hole.

15. The flexible display module of claim 1, wherein the display panel comprises a substrate, a thin film transistor device layer, an organic light emitting diode device layer, a touch screen, and a polarizer which are sequentially stacked.

16. The flexible display module of claim 15, wherein the display panel further comprises:
   a thin film encapsulation layer disposed on a surface of the organic light emitting diode device layer,
   wherein the thin film encapsulation layer is manufactured by atomic layer deposition, and/or
   a material of the thin film encapsulation layer is aluminum oxide, and/or
   a thickness of the thin film encapsulation layer is 25 nm to 50 nm.

17. A method for manufacturing a flexible display module as claimed in claim 1, comprising:
   providing the first flexible glass layer defining the groove;
   disposing the display panel inside the groove of the first flexible glass layer;
   disposing the second flexible glass layer on the display panel; and
   encapsulating a periphery of the second flexible glass layer and sides of the groove of the first flexible glass layer.

18. The flexible display module of claim 1, wherein the second flexible glass layer is disposed on an upper side of the display panel.

19. The flexible display module of claim 1, wherein an upper surface of the second flexible glass layer is coplanar with an upper surface of the first flexible glass layer.

* * * * *